United States Patent
Endo et al.

(10) Patent No.: US 9,002,494 B2
(45) Date of Patent: Apr. 7, 2015

(54) SUBSTRATE TRANSFER METHOD AND STORAGE MEDIUM

(75) Inventors: Eiki Endo, Miyagi (JP); Tatsuya Ogi, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 469 days.

(21) Appl. No.: 13/225,672

(22) Filed: Sep. 6, 2011

(65) Prior Publication Data

US 2012/0059502 A1 Mar. 8, 2012

Related U.S. Application Data

(60) Provisional application No. 61/383,503, filed on Sep. 16, 2010.

(30) Foreign Application Priority Data

Sep. 7, 2010 (JP) ................................. 2010-199892

(51) Int. Cl.
*H01L 21/677* (2006.01)
*H01L 21/67* (2006.01)

(52) U.S. Cl.
CPC .... *H01L 21/67748* (2013.01); *H01L 21/67126* (2013.01); *H01L 21/67742* (2013.01)

(58) Field of Classification Search
None
See application file for complete search history.

(56) References Cited

U.S. PATENT DOCUMENTS

| | | | |
|---|---|---|---|
| 4,944,246 A * | 7/1990 | Tanaka et al. ................. | 414/217 |
| 5,080,549 A * | 1/1992 | Goodwin et al. .......... | 414/744.8 |
| 5,876,280 A * | 3/1999 | Kitano et al. ................. | 454/187 |
| 6,467,491 B1 * | 10/2002 | Sugiura et al. ................. | 134/1.3 |
| 6,493,961 B2 * | 12/2002 | Ishii ................................... | 34/82 |
| 7,335,090 B2 * | 2/2008 | Takahashi et al. .............. | 451/41 |
| 7,699,932 B2 * | 4/2010 | Miller et al. ................... | 118/715 |
| RE43,023 E * | 12/2011 | Nakashima et al. .......... | 414/217 |
| 2002/0000240 A1 * | 1/2002 | Kamikawa ................... | 134/57 R |
| 2004/0029300 A1 * | 2/2004 | Iijima et al. ...................... | 438/14 |
| 2004/0240971 A1 * | 12/2004 | Tezuka et al. ................. | 414/217 |
| 2006/0105548 A1 * | 5/2006 | Kudo et al. .................... | 438/476 |
| 2006/0169207 A1 * | 8/2006 | Kobayashi et al. ........... | 118/715 |
| 2008/0187413 A1 * | 8/2008 | Kondoh ......................... | 414/217 |
| 2008/0220621 A1 * | 9/2008 | Shinozaki et al. ............ | 438/795 |
| 2010/0111648 A1 * | 5/2010 | Tamura et al. ................ | 414/217 |
| 2010/0132891 A1 * | 6/2010 | Nozawa .................... | 156/345.41 |
| 2010/0319730 A1 * | 12/2010 | Rebstock ........................ | 134/19 |

FOREIGN PATENT DOCUMENTS

| | | | |
|---|---|---|---|
| JP | 10-050623 A | | 2/1998 |
| JP | 2003-115518 A | | 4/2003 |
| JP | 2004063741 A | * | 2/2004 |
| JP | 2005-019960 A | | 1/2005 |
| JP | 2007149948 A | * | 6/2007 |
| JP | 2009-212453 A | | 9/2009 |
| WO | WO 2008041670 A1 | * | 4/2008 |

* cited by examiner

*Primary Examiner* — Ryan Jarrett
(74) *Attorney, Agent, or Firm* — Pearne & Gordon LLP

(57) ABSTRACT

There is provided a substrate transfer method capable of preventing fine particles from adhering to a wafer. A substrate processing system 10 includes process modules 12 to 17 each having therein an inner space S1; a transfer module 11, having an inner space S2, connected to the process modules 12 to 17; and opening/closing gate valves 30 each partitioning the inner space S1 and the inner space S2. The transfer module 11 includes in the inner space S2 a transfer arm device 21 for holding a wafer W and for loading/unloading the wafer W into/from the process modules 12 to 17. The transfer arm device 21 holds the wafer W at a retreated position deviated from a facing position facing the gate valve 30 during an opening motion of the gate valve 30.

4 Claims, 7 Drawing Sheets

--Prior Art--

*FIG. 6*
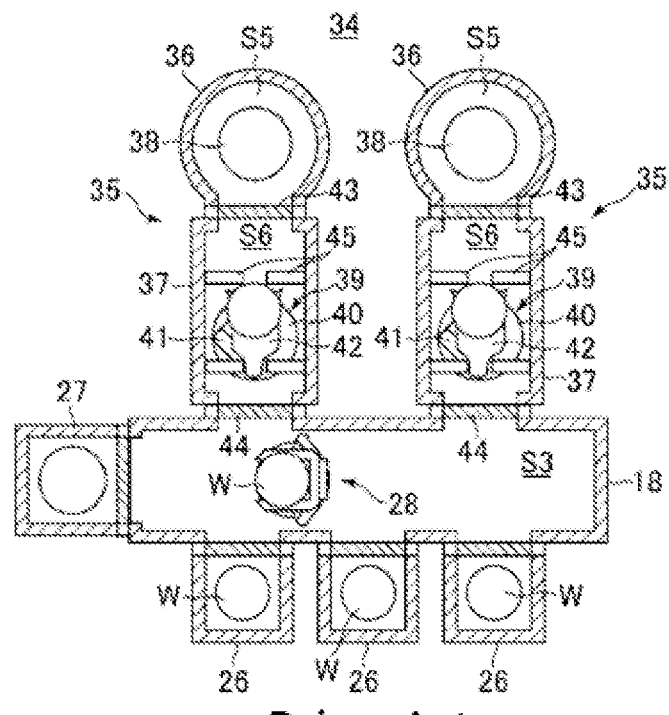
--Prior Art--
*FIG. 7A*  *FIG. 7B*  *FIG. 7C*  *FIG. 7D*
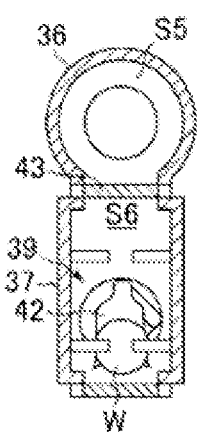 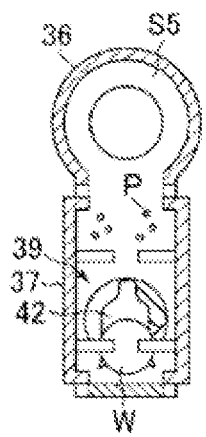 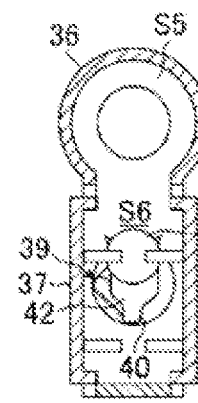 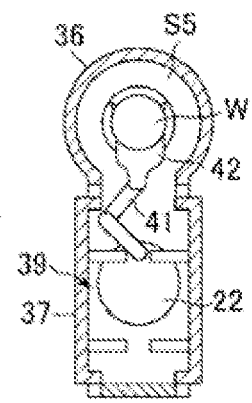

SUBSTRATE TRANSFER METHOD AND STORAGE MEDIUM

CROSS-REFERENCE TO RELATED APPLICATION

This application claims the benefit of Japanese Patent Application No. 2010-199892 filed on Sep. 7, 2010, and U.S. Provisional Application Ser. No. 61/383,503 filed on Sep. 16, 2010, the entire disclosures of which are incorporated herein by reference.

FIELD OF THE INVENTION

The present disclosure relates to a substrate transfer method for a substrate processing apparatus having an inner space partitioned by a gate valve, and a storage medium.

BACKGROUND OF THE INVENTION

Generally, a substrate processing system includes a multiple number of process modules for performing a plasma process on a semiconductor wafer (hereinafter, simply referred to as a "wafer") as a substrate by using plasma, and a transfer module for transferring a wafer between the process modules or between process modules and load lock modules for conveying a wafer (see, for example, Patent Document 1).

The process modules and the transfer module respectively have a depressurized inner space. The inner spaces of the process modules and the inner space of the transfer module are partitioned by opening/closing gate valves. Further, the transfer module has an extensible/contractible transfer arm. When the inner space of the process module and the inner space of the transfer module communicate with each other by opening the gate valve, the transfer arm enters the inner space of the process module and loads/unloads a wafer into and from the process module.

The wafer is held and transferred by the transfer arm. Recently, it is required to shorten a time for transferring the wafer in order to improve throughput of the plasma process on the wafer. That is, the wafer is kept on standby state in front of a closed gate valve by the transfer arm, and then, is loaded into the process module immediately after the gate valve is opened.

Patent Document 1: Japanese Patent Laid-open Publication No. 2009-212453 (FIG. 1)

However, when the gate valve is opened, a small amount of fine particles, e.g., particles having a diameter of several nm, may be produced by vibration caused by the opening motion of the gate valve or friction between the gate valve and another member.

Conventionally, although particles having a diameter of several nm adhere to a wafer, such particles cause only little adverse effects on the yield of semiconductor devices manufactured from the wafer. Recently, however, due to the miniaturization of wiring in semiconductor devices or the like, if particles having a diameter of several nm adhere to a wafer, semiconductor devices manufactured from the wafer is regarded as an inferior goods. Therefore, even if particles have a diameter of, e.g., several nm, it is necessary to prevent such particles from adhering to the wafer.

BRIEF SUMMARY OF THE INVENTION

In view of the above, the present disclosure provides a substrate transfer method capable of preventing fine particles from adhering to a substrate, and a storage medium.

In accordance with one aspect of the present disclosure, there is provided a substrate transfer method. The substrate transfer method may be performed by a substrate transfer system including: a substrate processing apparatus having therein a first inner space; a substrate transfer apparatus, having a second inner space, connected to the substrate processing apparatus; and an opening/closing partition valve for partitioning the first inner space and the second inner space. The substrate transfer apparatus may include in the second inner space a substrate transfer device for holding at least one substrate and for loading/unloading the at least one substrate into/from the substrate processing apparatus. The method may include holding the at least one substrate at a retreated position deviated from a facing position facing the partition valve by the substrate transfer device during an opening motion of the partition valve.

In the substrate transfer method, the substrate transfer device may move the at least one substrate in a circular motion, and the at least one substrate may be moved from the facing position to the retreated position.

In the substrate transfer method, the at least one substrate may be moved from the facing position to the retreated position by moving the at least one substrate in the circular motion at an absolute rotation angle of about 90° or more.

In the substrate transfer method, the at least one substrate may be plural in number, and the substrate transfer device may hold thereon the substrates and prevent the substrates from facing the partition valve during the opening motion of the partition valve.

In the substrate transfer method, the substrate transfer device may move the substrates from the retreated position to the facing position after the opening motion of the partition valve is finished.

In the substrate transfer method, a time during which the at least one substrate is retreated from the facing position may be changed depending on processes performed in the first inner space.

In the substrate transfer method, a time during which the at least one substrate is retreated from the facing position in case of cleaning components provided in the first inner space may be set to be longer than that in case of processing another substrate in the first inner space.

In accordance with another aspect of the present disclosure, there is provided a computer-readable storage medium having stored thereon computer-executable instruction that, in response to execution, causes a substrate transfer system to perform a substrate transfer method. The substrate transfer system may include a substrate processing apparatus having therein a first inner space; a substrate transfer apparatus, having a second inner space, connected to the substrate processing apparatus; and an opening/closing partition valve for partitioning the first inner space and the second inner space. The substrate transfer apparatus may include in the second inner space a substrate transfer device for holding at least one substrate and for loading/unloading the at least one substrate into/from the substrate processing apparatus. The method may include holding the at least one substrate at a retreated position deviated from a facing position facing the partition valve by the substrate transfer device during an opening motion of the partition valve.

In accordance with the present invention, a substrate is held and retreated from a position facing a partition valve by a substrate transfer device in the second inner space at least during the opening motion of the partition valve for partitioning the first inner space of a substrate processing apparatus and the second inner space of a substrate transfer apparatus.

Although a small amount of fine particles are produced near the facing position when the partition valve is opened, the floating fine particles are prevented from reaching the substrate because the substrate is retreated from the facing position. Accordingly, the adhesion of the fine particles to the substrate can be reduced.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

(FIG. 4A shows a first example, FIG. 4B shows a second example, FIG. 4C shows a third example, and FIG. 4D shows a fourth example);

FIG. 6 is a horizontal cross sectional view schematically showing a configuration of a substrate processing system for performing a substrate transfer method in accordance with a second embodiment of the present disclosure;

FIGS. 7A to 7D are flowcharts illustrating the substrate transfer method in accordance with the second embodiment of the present disclosure.

DETAILED DESCRIPTION OF THE INVENTION

Hereinafter, embodiments of the present disclosure will be described in detail with reference to the accompanying drawings.

First, a substrate processing system for performing a substrate transfer method in accordance with a first embodiment of the present disclosure will be described.

Figure 1:
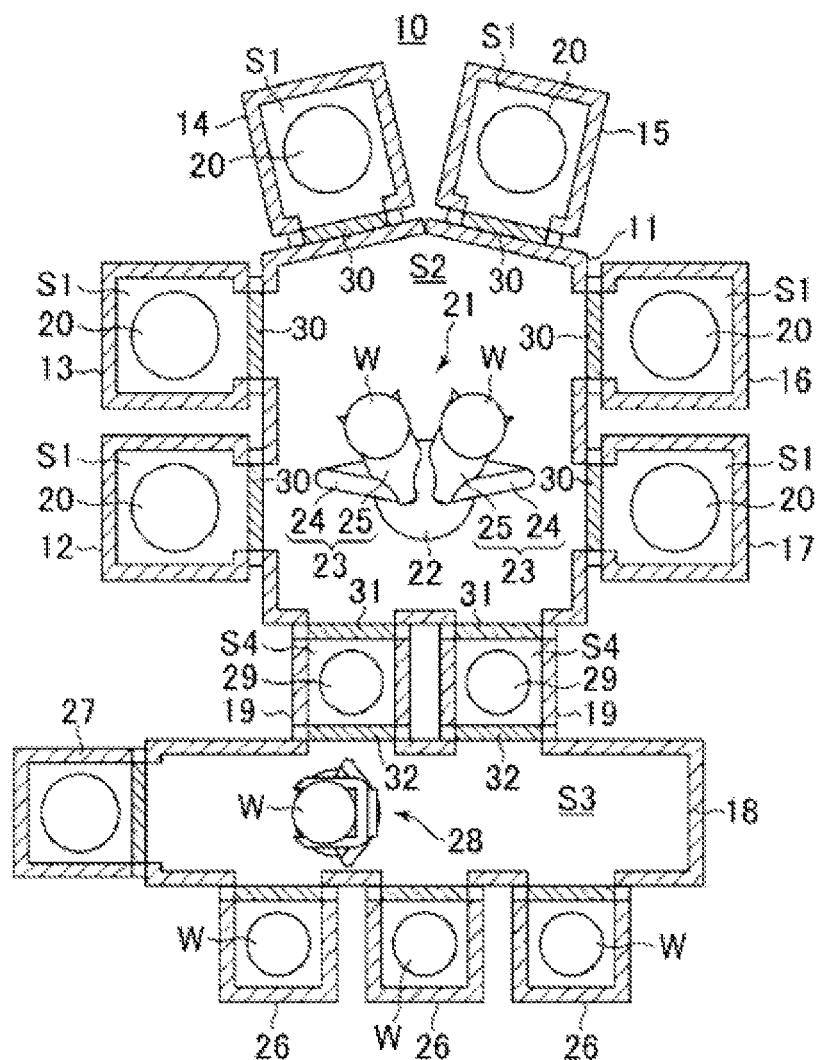
FIG. 1 is a horizontal cross sectional view schematically showing a configuration of a substrate processing system for performing a substrate transfer method in accordance with a first embodiment of the present disclosure.

FIG. 1 is a horizontal cross sectional view showing a schematic configuration of the substrate processing system for performing the substrate transfer method in accordance with the first embodiment.

In FIG. 1, a substrate processing system 10 may include, when viewed from the top, a pentagonal transfer module 11 (substrate transfer apparatus), six process modules 12 to 17 (substrate processing apparatuses) positioned to surround all sides except one of the transfer module 11, a rectangular loader module 18, when viewed from the top, and two load lock modules 19 positioned along the rest one side of the transfer module 11 so as to connect the transfer module 11 and the loader module 18.

Each of the process modules 12 to 17 may include an inner space S1 (first inner space) maintained in a vacuum state, and a mounting table 20 for mounting thereon a substrate for a semiconductor device (hereinafter, referred to as a "wafer" W) is provided within the inner space S1. Each of the process modules 12 to 17 may perform a certain plasma process, e.g., a plasma etching process on the wafer W mounted on the mounting table 20 by using plasma generated in the inner space S1.

The transfer module 11 may have an inner space S2 (second inner space) maintained in a vacuum state. Provided in the inner space S2 is a transfer arm device 21 (substrate transfer device) for transferring the wafer W between the process modules 12 to 17 or between the load lock modules 19 and the process modules 12 to 17. The transfer arm device may have a base 22 capable of moving in a horizontal direction and rotating on a horizontal plane within the inner space S2; and two transfer arms 23 provided on the base 22. Each transfer arm 23 may have an extensible/contractible arm 24 of a scalar arm type, and a pick 25 provided at one end of the arm 24, for holding the wafer W. The transfer arm device 21 may load and unload the wafer into/from each of the process modules 12 to 17 or into/from each of the load lock modules 19 by extending/contracting the transfer arm 23 and by rotating the base 22.

At the loader module 18, three FOUPs (Front Opening Unified Pods) 26 each for accommodating therein a multiple number of wafers W may be provided so as to face the load lock modules 19 with the loader module 18 interposed therebetween. Further, an orienter 27 may be located at one end of the loader module 18 in a lengthwise direction.

The loader module 18 may have an inner space S3 maintained in an atmospheric atmosphere. Within the inner space S3, a transfer arm device 28 for transferring the wafer W among each FOUP 26, each load lock module 19, and the orienter 27 is provided. The orienter 27 may pre-align the position of the wafer W unloaded from the FOUP 26.

Each load lock module 19 may have an inner space S4, and the inner space S4 may be switched from an atmospheric atmosphere to a vacuum atmosphere, or vice versa. An exchange table 29 for mounting thereon the wafer W may be provided within the inner space S4. Each load lock module 19 may transfer the wafer W to/from the transfer arm device 28 by communicating the inner space S4 to the inner space S3 of the loader module 18 after turning the inner space S4 into the atmospheric atmosphere. Further, after turning the inner space S4 into the vacuum atmosphere, each load lock module 19 may communicate the inner space S4 to the inner space S2 of the transfer module 11. Then, each load lock module 19 may transfer the wafer W to/from the transfer arm device 21.

Furthermore, the substrate processing system 10 may include gate valves 30 (partition valves) provided between each of the process modules 12 to 17 and the transfer module 11; gate valves 31 provided between the transfer module 11 and each of the load lock modules 19; and gate valves 32 provided between each of the load lock modules 19 and the loader module 18. The respective gate valves 30 to 32 may be formed as a plate-shaped valve moving in a sliding motion. Each gate valve 30 may partition the inner spaces S1 and the inner space S2, and each gate valve 31 may partition the inner space S2 and the inner spaces S4. Further, each gate valve 32 may partition the inner spaces S4 and the inner space S3.

Figure 2:
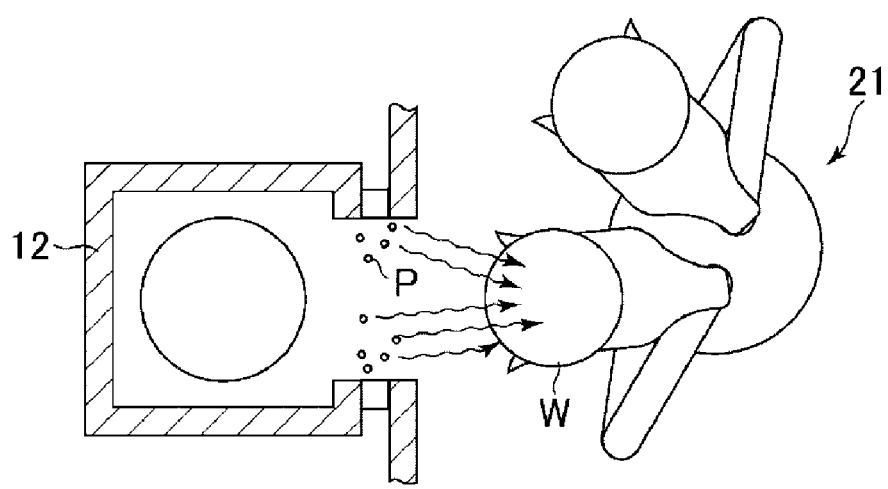
FIG. 2 illustrates dispersion of fine particles produced by an opening motion of a gate valve.

However, as described above, when the gate valve 30 is opened, deposits attached to an inner wall of the process module 12 may be detached due to vibrations generated by an opening motion of the gate valve 30, and the detached deposits may produce a small amount of fine particles. Further, a small amount of fine particles may also be generated due to friction between the gate valve 30 and another member within the process module 12. At this time, if the wafer W is on standby state at a position (facing position) facing the gate valve 30 of the process module 12 by the transfer arm device 21, fine particles P produced by the opening motion of the gate valve 30 may float, reach the wafer W, and then, adhere to the wafer W, as shown in FIG. 2.

To solve this problem, in the first embodiment, the wafer W may be positioned at a position retreated from the gate valve 30 (hereinafter, simply referred to as a "retreated position") deviated from a position facing the gate valve 30 (hereinafter, simply referred to as a "facing position") by the transfer arm device 21 during the opening motion of the gate vale 30.

FIGS. 3A to 3E are flowcharts illustrating the substrate transfer method in accordance with the first embodiment. FIGS. 3A to 3E illustrate parts of horizontal cross sectional views of the substrate processing system 10 shown in FIG. 1.

Figure 3A:
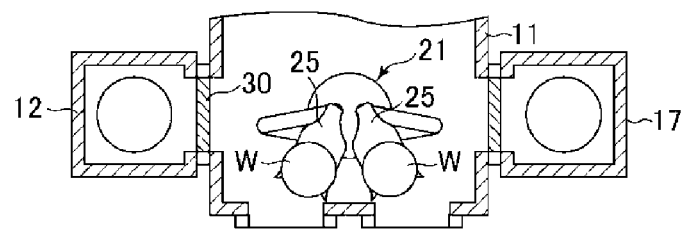
FIGS. 3A to 3E are flowcharts illustrating the substrate transfer method in accordance with the first embodiment of the present disclosure.

Referring to FIGS. 3A to 3E, when the inner space S4 of the load lock module 19 and the inner space S2 of the transfer module 11 communicate with each other by opening the gate valve 31, the transfer arm device 21 may receive two unprocessed wafers W from the exchange tables 29 of the load lock module 19 by the transfer arms 23, and hold the unprocessed wafers W by the picks 25 (FIG. 3A).

Figure 3B:
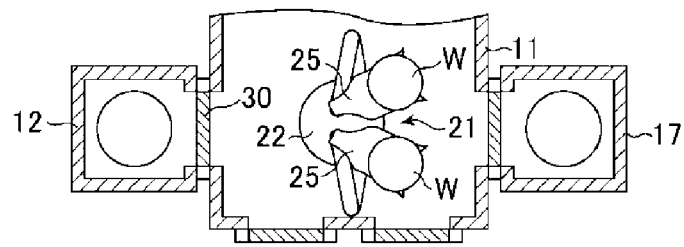
Figure 3C:
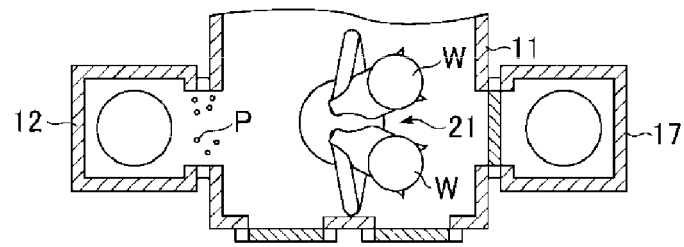
Figure 3D:
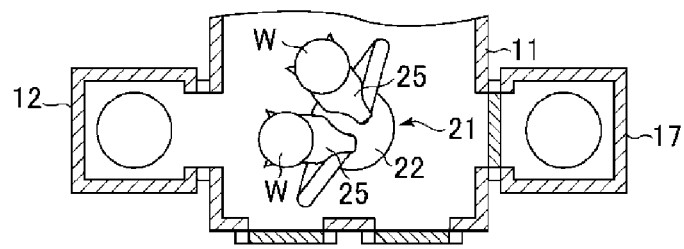
Figure 3E:
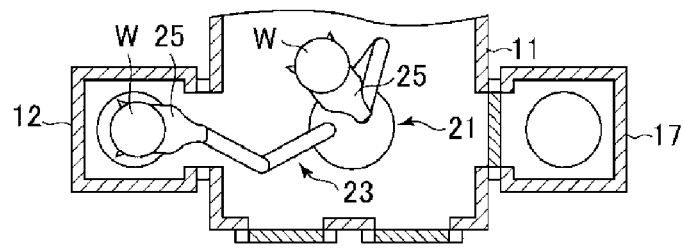

Thereafter, the transfer arm device 21 moves each of the wafers W held by the picks 25 in a circular motion by rotating the base 22. As a result, each of the wafers W may be moved to the retreated position distanced from the facing position by a certain distance, e.g., about 200 mm or more (FIG. 3B).

Figure 4A:
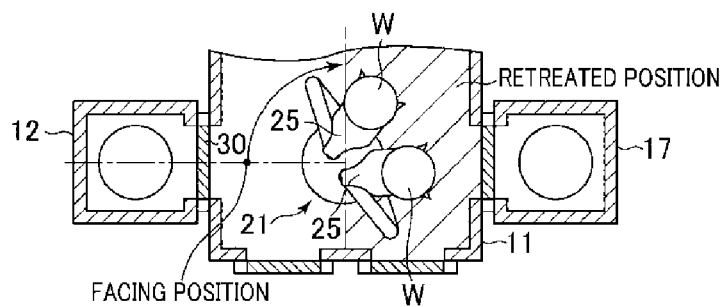
FIGS. 4A to 4D illustrate a retreated position in the substrate transfer method in accordance with the first embodiment of the present disclosure.
Figure 4B:
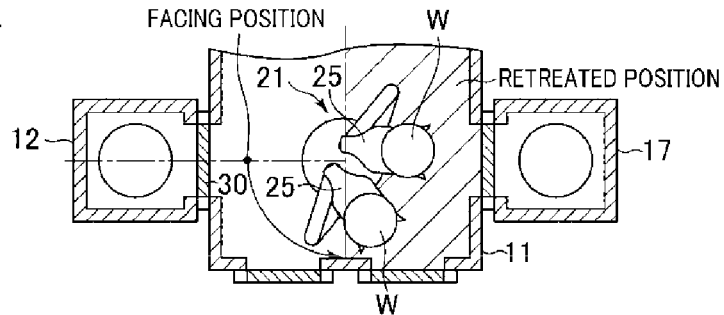
Figure 4C:
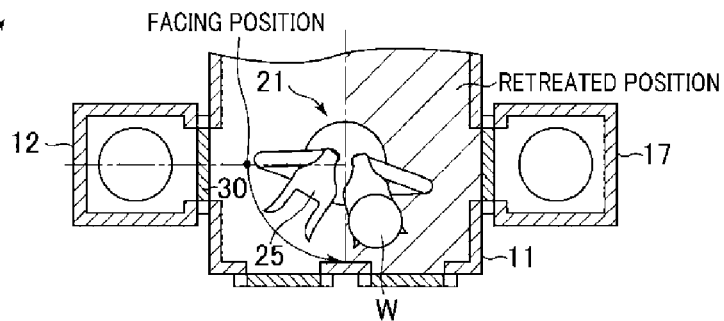
Figure 4D:
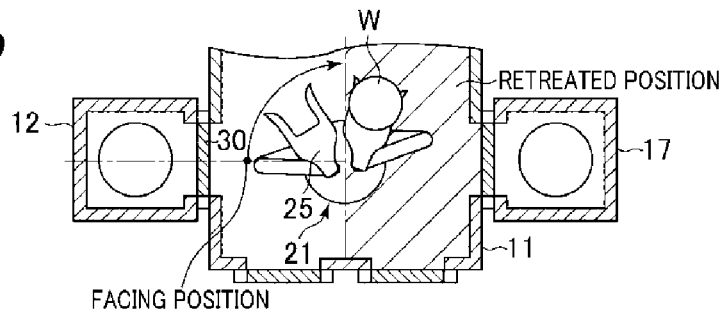

In the present embodiment, it may be preferable that the retreated position be distant from the facing position as far as possible. At least, it may be desirable that the retreated position be set to a position where the wafer W held by the pick 25 can arrive by moving in a circular motion from the facing position at a rotation angle of about 90° or more in a clockwise or a counterclockwise direction. Here, if two wafers W are held by the transfer arm device 21, it is necessary that both of the two wafers W are retreated to a position where they can arrive by moving in a circular motion from the facing position at a rotation angle of about 90° or more in the clockwise or the counterclockwise direction (see, e.g., FIGS. 4A and 4B, the retreated position being indicated by shaded lines in the drawings). Meanwhile, if a single wafer W is held by the transfer arm device 21, it is sufficient that only the single wafer W is retreated to a position where it can arrive by moving in a circular motion from the facing position at a rotation angle of about 90° or more in the clockwise or the counterclockwise direction. That is, the pick 25 that does not hold a wafer W may be on standby state in a position where it can arrive by moving in a circular motion from the facing position at a rotation angle of about 90° or less in the clockwise or the counterclockwise direction (see, e.g., FIGS. 4C and 4C, the retreated position being indicated by shaded lines in the drawings).

Subsequently, the wafer W held by the pick 25 may be stopped at the retreated position by the transfer arm device during the opening motion of the gate valve 30 after completing a process in the inner space S1 of the process module 12. The process includes, e.g., a WLDC (Wafer Less Dry Cleaning) process for cleaning components in the inner space S1 by using plasma. At this time, a small amount of fine particles P are produced by the opening motion of the gate vale 30. However, since the wafer W is distant from the gate valve 30, although the fine particles P are floating and moving, they may not reach the wafer W (see FIG. 3C).

Then, the opening motion of the gate valve 30 is finished, and the inner space S1 of the process module 12 and the inner space S2 of the transfer module 11 may communicate with each other. Thereafter, the transfer arm device 21 may rotate the base 22 to move the wafers W held by the picks 25 in a circular motion, so that a single wafer W may move from the retreated position to the facing position (see FIG. 3D). At this time, the fine particles P produced due to the opening motion of the gate valve 30 may have fallen to a lower region of the inner space S2 by the gravity, and thus may not be floating near the facing position. Hence, the fine particles P do not adhere to the wafer W that has been moved to the facing position.

Thereafter, the transfer arm device 21 may load the wafer W held by the pick 25 into the process module 12 by extending the transfer arm 23 (FIG. 3E), and the substrate transfer method of the present embodiment may be completed.

In accordance with the substrate transfer method of the present embodiment, the transfer arm device 21 in the inner space S2 may position the wafer W held by the pick 25 at the retreated position from the facing position during the opening motion of the gate valve 30. Although a small amount of fine particles P may be produced by the opening motion of the gate valve 30, the floating fine particles P are prevented from reaching the wafer W because the wafer W is retreated from the facing position. Therefore, it is possible to prevent the fine particles P from adhering to the wafer W.

In the substrate transfer method of the present embodiment, the transfer arm device 21 may move the wafers W held by the picks 25 in a circular motion from the facing position to the retreat position. Accordingly, since the base 22 is only rotated without being horizontally moved, it is possible to retreat the wafer W in a short period of time. Further, the movement from the retreated position to the facing position also can be made in a circular motion, so that the time required for moving from the retreated position to the facing position can be shortened. As a result, the time required for processing the wafer W can be shortened.

Moreover, in the substrate transfer method of the present embodiment, the transfer arm device 21 may move the wafer W from the retreated position to the facing position after the opening motion of the gate valve 30 is finished. After the opening motion of the gate valve 30 is finished, the fine particles P caused by the opening motion of the gate valve 30 may not be produced. Further, the fine particles P produced due to the opening motion of the gate valve 30 may have fallen to the lower region of the inner space S2. Thus, it is also possible to prevent the fine particles P from adhering to the wafer W.

In the substrate transfer method of the present embodiment, the WLDC process may be performed in the inner space S1 of the process module 12. However, processes performed in the inner space S1 may not be limited thereto. In addition, the time during which the wafer W is retreated from the facing position (hereinafter, simply referred to as a "retreating time") may be changed depending on processes performed in the inner space S1. Specifically, in case where a process that generates a large amount of particles, e.g., a plasma etching process using a CF-based processing gas or a WLDC process, is performed in the inner space S1, the retreating time may be set to be relatively long, and the wafer W may move from the retreated position to the facing position after a certain time period elapses since the opening motion of the gate valve 30. On the other hand, in case where a process that does not generate a large amount of particles, e.g., a plasma etching process using a processing gas mainly containing oxygen gas, is performed in the inner space S1, the retreating time may be set to be relatively short, and the wafer W may move from the retreated position to the facing position immediately after the opening motion of the gate valve 30 is finished.

If a process that generates a large amount of particles is performed in the inner space S1, there is a high possibility that the fine particles may float near the facing position until a certain time period elapses since the opening motion of the gate valve 30. However, if a process that does not generate a large amount of particles is performed in the inner space S1, there is a low possibility that the fine particles may float near the facing position shortly after the opening motion of the gate valve 30 is finished. Accordingly, it may be possible to prevent the fine particles from adhering to the wafer W, and to improve the processing efficiency by changing the retreating time depending on processes performed in the inner space S1 of the process module 12.

Processes performed in the inner space S1 of the process module 12 may not be limited to the above. By way of example, a charge neutralization process for an electrode may be performed. The WLDC process produces a large amount of particles in the inner space S1. Accordingly, the retreating time in performing the WLDC process may be preferably set to be longer than the retreating time in performing a plasma etching process on another wafer W in the inner space S1. Hence, it is possible to securely prevent the fine particles P from adhering to the wafer W.

Both of the substrate transfer method of the present embodiment and the conventional substrate transfer method in which the wafer W is on standby state at the facing position during the opening motion of the gate valve 30 may be carried out by the same substrate processing system 10. In that case, the state where fine particles are generated by the opening motion of the gate valve 30 may be monitored by comparing the number of fine particles adhering to the wafer W transferred by each different substrate transfer method.

In the above described substrate transfer method of the present embodiment, the wafer W may be moved to the retreated position only by a circular motion. However, the wafer W may be moved to a retreated position by horizontally moving, and then, rotating the base 22 by the transfer arm device 21. Accordingly, the wafer W can be further away from the facing position, and it is possible to reliably prevent the fine particles P from adhering to the wafer W.

Alternatively, the wafer W may be retreated from the facing position by a vertical motion instead of a circular motion.

FIGS. 5A to 5E are flowcharts illustrating a modification of the substrate transfer method of the first embodiment. FIGS. 5A to 5E illustrate parts of vertical cross sectional views of the substrate processing system 10 shown in FIG. 1.

Figure 5A:
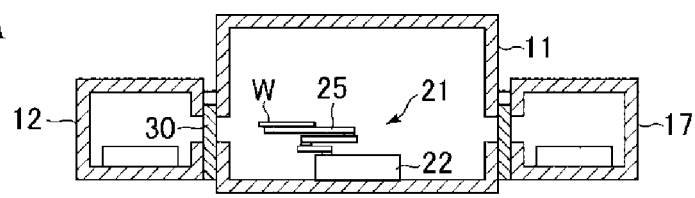
FIGS. 5A to 5E are flowcharts illustrating a modification of the substrate transfer method in accordance with the first embodiment of the present disclosure.

Referring to FIGS. 5A to 5E, the transfer arm device 21 may receive two unprocessed wafers W from the exchange tables 29 of the load lock module 19 by the transfer arms 23, and hold the unprocessed wafers W by the picks 25. Then, the transfer arm device 21 may move the wafers W held by the picks 25 in a circular motion by rotating the base 22, so that the wafers may be moved to the facing position (FIG. 5A).

Figure 5B:
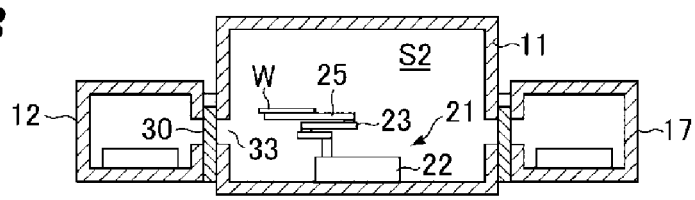

Subsequently, the transfer arm device 21 may move the wafers W to a retreated position in an upper region of the inner space S2 by lifting up the transfer arms 23 together with the wafers W held by the picks 25. At least, the retreated position in the modification of the substrate transfer method of the first embodiment may be set to be located in a position higher than a port 33 for communicating the inner space S1 of the process module 12 to the inner space S2 of the transfer module 11 while the gate valve 30 is open (FIG. 5B).

Figure 5C:
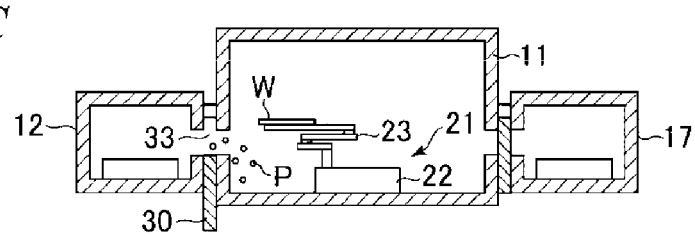

Then, the wafers W held by the picks 25 may be stopped at the retreated position by the transfer arm device during the opening motion of the gate valve 30 after completing a WLDC process in the inner space S1 of the process module 12. At this time, a small amount of fine particles P may be produced by the opening motion of the gate valve 30. However, since the wafers W are positioned above the port 33, the fine particles P that descend from the port 33 to the lower region of the inner space S2 by gravity may not reach the wafers W (FIG. 5C).

Figure 5D:
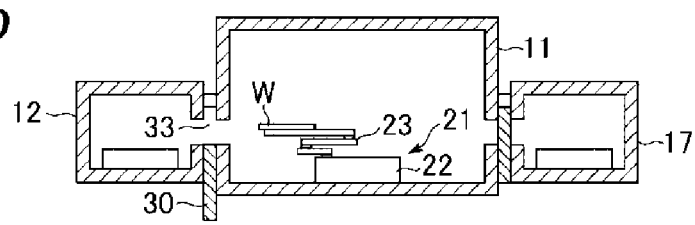

Thereafter, the opening motion of the gate valve 30 is finished, and the inner space S1 of the process module 12 and the inner space S2 of the transfer module 11 communicate with each other. Then, the transfer arm device 21 may move the wafers W from the retreated position to the facing position by lifting down the transfer arms 23 and the picks 25 (FIG. 5D).

Figure 5E:
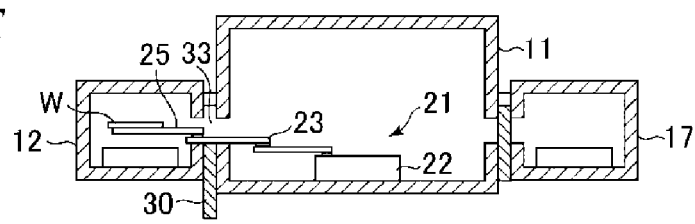

Subsequently, the transfer arm device 21 may load the wafer W held by the pick 25 into the process module 12 by extending the transfer arm 23 (FIG. 5E). As a result, the modification of the substrate transfer method of the present embodiment may be completed.

The modification of the substrate transfer method of the first embodiment may also prevent the fine particles P from reaching the wafer W. Accordingly, it is possible to prevent the fine particles P from adhering to the wafer W.

Hereinafter, a substrate processing system for performing a substrate transfer method in accordance with a second embodiment of the present disclosure will be described.

FIG. 6 is a horizontal cross sectional view schematically showing a configuration of the substrate processing system for performing the substrate transfer method of the second embodiment. Further, like reference numerals are given to like parts corresponding to those of the substrate processing system 10 of FIG. 1, and redundant description thereof will be omitted.

Referring to FIG. 6, the substrate processing system 34 may include two process ships 35 and a loader module 18 connected with the two process ships 35.

The two process ships 35 may be connected to a sidewall of the loader module 18 in a longitudinal direction thereof and disposed so as to face three FOUPs 26 with the loader module 18 interposed therebetweeen.

Each process ship 35 may include a process module 36 for performing a plasma process on a wafer W, and a load lock module 37 for loading and unloading the wafer W into and from the process module 36. In each process ship 35, the process module 36 may be connected to the loader module 18 via the load lock module 37.

The process module 36 may have an inner space S5 (first inner space) maintained in a vacuum atmosphere, and a mounting table 38 for mounting thereon the wafer W is provided in the inner space S5. The process module 36 may perform a certain plasma process, e.g., a plasma etching process, on the wafer W mounted on the mounting table 38 by using plasma generated in the inner space S5.

Each load lock module 37 may have an inner space S6 (second inner space), and the inner space S6 may be switched from an atmospheric atmosphere to a vacuum atmosphere, or vice versa. In the inner space S6, a transfer arm device 39 (substrate transfer device) for transferring the wafer W between the process module 36 and the loader module 18 may be provided. The transfer arm device 39 may include a base and a single extensible/contractible transfer arm 41. The base 40 is configured to move in a linear motion between the process module 36 and the loader module 18 in the inner space S6 and to rotate on the horizontal plane. The transfer arm 41 is provided on the base 40. The transfer arm 41 may have a pick 42 for holding a wafer W. Moreover, the load lock module 37 may include a buffer 45 for receiving the wafer W transferred by the transfer arm device 39 and holding the received wafer W at a position deviated from a transfer route of the wafer W In addition, the substrate processing system 34 may include gate valves 43 (partition valves) provided between the process modules 36 and the load lock modules 37, and gate vales 44 provided between the load lock modules 37 and the loader module 18. The respective gate valves 43 and 44 may be formed as a plate-shaped valve moving in a sliding motion. Each gate valve 43 may partition the inner spaces S5 and S6. Each gate valve 44 may partition the inner spaces S6 and S3.

FIGS. 7A to 7D are flowcharts illustrating the substrate transfer method of the second embodiment. FIGS. 7A to 7D illustrate parts of horizontal cross sectional views of the substrate processing system of FIG. 6.

Referring to FIGS. 7A to 7D, if the inner space S3 of the loader module 18 and the inner space S6 of the load lock module 37 communicate with each other by opening the gate valve 44, the transfer arm device 39 may receive an unprocessed wafer W from the transfer arm device 28 of the loader module 18, and hold the unprocessed wafer W by the pick 42. Thereafter, the transfer arm device 39 may move the base 40 toward the process module 36 by a certain distance without rotating the base 40. As a result, the wafer W held by the pick 42 is moved to a retreated position near the loader module 18 in the inner space S6 (FIG. 7A).

Subsequently, the wafer W held by the pick 42 may be stopped at the retreated position by the transfer arm device during the opening motion of the gate valve 43 after completing a WLDC process (cleaning process) in the inner space S5 of the process module 36. At this time, a small amount of fine particles P may be produced by the opening motion of the gate valve 43. However, since the wafer W is distanced from the gate valve 43, although the particles P may float, they may not reach the wafer W (FIG. 7B).

Then, the opening motion of the gate valve 43 is finished, and the inner space S5 of the process module 36 and the inner space S6 of the load lock module 37 communicate with each other. Thereafter, the transfer arm device 39 may move the wafer W held by the pick 42 from the retreated position to the facing position by rotating and moving the base 40 toward the process module 36 (FIG. 7C). At this time, since the fine particles P produced by the opening motion of the gate valve 43 may have descended to the lower region of the inner space S6 by gravity, the fine particles P may not float near the facing position. Therefore, the fine particles P may not adhere to the wafer W that has been moved to the facing position.

Subsequently, the transfer arm device 39 may load the wafer W held by the pick 42 into the process module 36 by extending the transfer arm 41 (FIG. 7D), and the substrate transfer method of the second embodiment may be completed.

In accordance with the substrate transfer method of the second embodiment, the transfer arm device 39 in the inner space S6 may hold the wafer W held by the pick 42 at the retreated position, which is distanced from the facing position, near the loader module 18 during the opening motion of the gate valve 43. Therefore, it may be possible to suppress the floating fine particles P produced by the opening motion of the gate valve 43 from reaching the wafer W. Accordingly, it is possible to prevent the fine particles P from adhering to the wafer W.

In the above described substrate transfer method of the second embodiment, the wafer W is moved to the retreated position by the transfer arm device 39. However, the wafer W may also be retreated by the buffer 45.

FIGS. 8A to 8E are flowcharts illustrating a modification of the substrate transfer method of the second embodiment. FIGS. 8A to 8E illustrate parts of vertical cross sectional views of the substrate processing system of FIG. 6.

Figure 8A:
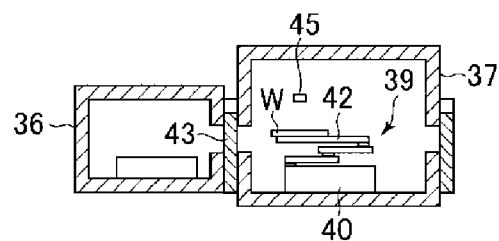
FIGS. 8A to 8E are flowcharts illustrating a modification of the substrate transfer method in accordance with the second embodiment of the present disclosure.

Referring to FIGS. 8A to 8E, the transfer arm device 39 may receive an unprocessed wafer W from the transfer arm device 28 of the loader module 18, and hold the unprocessed wafer by the pick 42. Then, the transfer arm device 39 may move the wafer W held by the pick 42 to the facing position by rotating and moving the base 40 toward the process module 36 (FIG. 8A).

Figure 8B:
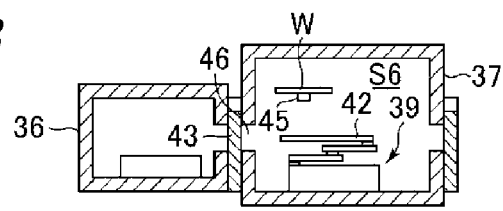

Subsequently, the buffer 45 may receive the wafer W held by the pick 42 and lift up the wafer W to the retreated position in an upper region of the inner space S6. At least, the retreated position in the modification of the substrate transfer method of the second embodiment may be set to be located in a position higher than a port 46 for communicating the inner space S5 of the process module 36 to the inner space S6 of the load lock module 37 while the gate valve 43 is open (FIG. 8B).

Figure 8C:
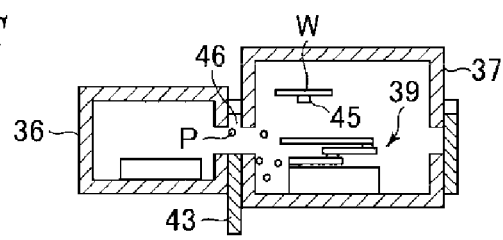

Thereafter, the wafer W may be stopped at the retreated position by the buffer 45 during the opening motion of the gate valve 43 after completing a WLDC process in the inner space S5 of the process module 36. At this time, a small amount of fine particles P may be produced by the opening motion of the gate valve 43. However, the fine particles P descending to the lower portion of the inner space S6 by gravity may not reach the wafer W because the wafer W is positioned above the port 46 (FIG. 8C).

Figure 8D:
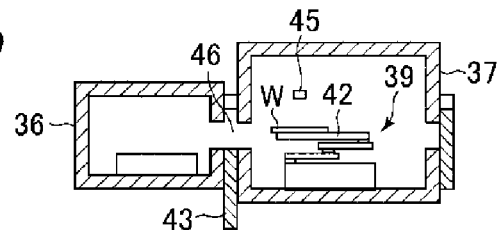
Figure 8E:
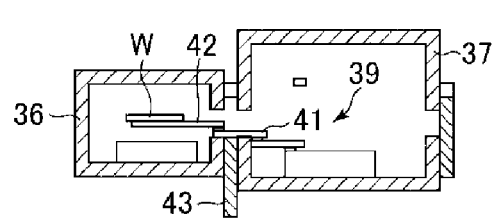

Then, the opening motion of the gate valve 43 is finished, and the inner space S5 of the process module 36 and the inner space S6 of the load lock module 37 communicate with each other. Thereafter, the wafer W is lowered by the buffer 45 and transferred to the pick 42. Accordingly, the wafer W may be moved from the retreated position to the facing position (FIG. 8D).

Subsequently, the transfer arm device 39 may load the wafer W held by the pick 42 into the process module 36 by extending the transfer arm 41 (FIG. 8E), and the modification of the substrate transfer method of the second embodiment may be completed.

The modification of the substrate transfer method of the present embodiment can prevent the fine particles P from reaching the wafer W. Accordingly, it is possible to prevent the fine particles P from adhering to the wafer W.

A substrate subjected on which a certain plasma process is performed by the substrate processing system for carrying out the substrate transfer method of the embodiments described above may not be limited to a wafer for semiconductor devices. The substrate may be various substrates used for, e.g., a flat panel display (FPD) including a liquid crystal display (LCD) or the like, a photomask, a CD substrate, a printed circuit board or the like.

While the present disclosure has been described with respect to the embodiments described above, the present disclosure is not limited to the embodiments described above.

It is to be understood that the object of the present disclosure can also be achieved by supplying to a computer or the like a storage medium storing therein a software program for executing the functions of the embodiments described above, and then by reading and executing the program stored in the storage medium by a CPU of the computer.

In this case, the program read from the storage medium may implement the functions of each embodiment described above. Accordingly, the program and the storage medium storing therein the program may constitute the present disclosure.

Moreover, the storage medium for storing the program may include such as a RAM, a NV-RAM, a floppy (registered trademark) disk, a hard disk, a magnetic-optical disk, an optical disk such as a CD-ROM, a CD-R, a CD-RW, a DVD (a DVD-ROM, a DVD-RAM, a DVD-RW, or a DVD+RW), a magnetic tape, a non-volatile memory card, or a ROM, which can memorize the program. Alternatively, the program may be supplied to the computer by downloading it from another computer or database, or a computer (not shown) connected to the Internet, a commercial network, a local area network (LAN) or the like.

Besides, it is to be understood that the functions of each embodiment described above may be implemented by executing the program read by a CPU of the computer, and an OS (operating system) or the like that operated on the CPU may perform a part or all of the actual process in response to instructions of the program and the functions of each embodiment may be implemented by the process.

Furthermore, it is to be understood that the program read from the storage medium may be written in a function extension board inserted into the computer or a function extension unit connected to the computer, and a CPU of the function extension board or the function extension unit may perform a part or all of the actual process in response to instructions of the program and the function of each embodiment may be implemented by the process.

The program may include an object code, a program executable by an interpreter, script data provided to an OS or the like.

What is claimed is:

1. A substrate transfer method performed by a substrate transfer system including: a substrate processing apparatus having therein a first inner space; a substrate transfer apparatus, having a second inner space, connected to the substrate processing apparatus; an opening/closing partition valve for partitioning the first inner space and the second inner space; and a buffer for receiving the substrate within the second inner space, the substrate transfer apparatus including in the second inner space a substrate transfer device for holding at least one substrate and for loading/unloading the at least one substrate into/from the substrate processing apparatus, the method comprising:

before an opening motion of the opening/closing partition valve is started, transferring the substrate from the substrate transfer device to the buffer and lifting the substrate up to a retreated position which is higher than a port for communicating the first inner space to the second inner space; and after the opening motion of the opening/closing partition valve is finished, lowering the substrate to a height corresponding to said port and transferring the substrate from the buffer to the substrate transfer device, so that the substrate is positioned at a facing position facing the opening/closing partition valve.

2. The substrate transfer method of claim 1, wherein a time during which the at least one substrate is retreated from the facing position is changed depending on processes performed in the first inner space.

3. The substrate transfer method of claim 2, wherein a time during which the at least one substrate is retreated from the facing position in case of cleaning components provided in the first inner space is set to be longer than a time during which the at least one substrate is retreated from the facing position in case of processing another substrate in the first inner space.

4. A non-transitory computer-readable storage medium having stored thereon computer-executable instruction that, in response to execution, causes a substrate transfer system to perform a substrate transfer method, the substrate transfer system including: a substrate processing apparatus having therein a first inner space; a substrate transfer apparatus, having a second inner space, connected to the substrate processing apparatus; an opening/closing partition valve for partitioning the first inner space and the second inner space; and a buffer for receiving the substrate within the second inner space, the substrate transfer apparatus including in the second inner space a substrate transfer device for holding at least one substrate and for loading/unloading the at least one substrate into/from the substrate processing apparatus, the method comprising:

before an opening motion of the opening/closing partition valve is started, transferring the substrate from the substrate transfer device to the buffer and lifting the substrate up to a retreated position which is higher than a port for communicating the first inner space to the second inner space; and after the opening motion of the opening/closing partition valve is finished, lowering the substrate to a height corresponding to said port and transferring the substrate from the buffer to the substrate transfer device, so that the substrate is positioned at a facing position facing the opening/closing partition valve.

\* \* \* \* \*

UNITED STATES PATENT AND TRADEMARK OFFICE
CERTIFICATE OF CORRECTION

PATENT NO. : 9,002,494 B2
APPLICATION NO. : 13/225672
DATED : April 7, 2015
INVENTOR(S) : Eiki Endo It is certified that error appears in the above-identified patent and that said Letters Patent is hereby corrected as shown below:

In the specification, column 4, lines 13-14, please add -- 21 -- between "arm device" and "may have"

In the specification, column 5, lines 55-56, please add -- 21 -- between "arm device" and "during the"

In the specification, column 7, line 64, please add -- 21 -- between "arm device" and "during the"

In the specification, column 9, lines 29-30, please add -- 39 -- between "arm device" and "during the"

Signed and Sealed this
Thirteenth Day of October, 2015

Michelle K. Lee
*Director of the United States Patent and Trademark Office*